United States Patent
Ishino et al.

(10) Patent No.: US 8,334,465 B2
(45) Date of Patent: Dec. 18, 2012

(54) WAFER OF CIRCUIT BOARD AND JOINING STRUCTURE OF WAFER OR CIRCUIT BOARD

(75) Inventors: Masakazu Ishino, Tokyo (JP); Hiroaki Ikeda, Tokyo (JP); Hideharu Miyake, Tokyo (JP); Shiro Uchiyama, Tokyo (JP); Hiroyuki Tenmei, Tokyo (JP); Kunihiko Nishi, Tokyo (JP); Yasuhiro Naka, Tokyo (JP); Nae Hisano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 614 days.

(21) Appl. No.: 12/285,222

(22) Filed: Sep. 30, 2008

(65) Prior Publication Data
US 2009/0109641 A1 Apr. 30, 2009

(30) Foreign Application Priority Data
Oct. 12, 2007 (JP) ................................. 2007-266716

(51) Int. Cl.
*H05K 1/16* (2006.01)
*H05K 1/00* (2006.01)
*H05K 1/03* (2006.01)
*H01L 23/48* (2006.01)
*H01L 23/52* (2006.01)
*H01L 29/40* (2006.01)

(52) U.S. Cl. ........ 174/260; 174/250; 174/255; 257/778; 257/738; 257/777

(58) Field of Classification Search ........................ None
See application file for complete search history.

(56) References Cited

U.S. PATENT DOCUMENTS

| 5,367,765 | A | * | 11/1994 | Kusaka | 29/840 |
| 6,879,041 | B2 | * | 4/2005 | Yamamoto et al. | 257/737 |
| 6,919,137 | B2 | * | 7/2005 | Kawashima et al. | 428/617 |
| 7,547,577 | B2 | * | 6/2009 | Card et al. | 438/108 |
| 2001/0011777 | A1 | * | 8/2001 | Kano | 257/781 |
| 2002/0121709 | A1 | | 9/2002 | Matsuki et al. | |

FOREIGN PATENT DOCUMENTS

| JP | 10-308415 | 11/1998 |
| JP | 11-204939 | 7/1999 |
| JP | 2002-198485 | 7/2002 |
| JP | 2002-203925 A | 7/2002 |

OTHER PUBLICATIONS

Korean Office Action dated Aug. 24, 2010, with English and Japanese translations.

* cited by examiner

*Primary Examiner* — Jayprakash N Gandhi
*Assistant Examiner* — Dion Ferguson
(74) *Attorney, Agent, or Firm* — McGinn IP Law Group, PLLC

(57) ABSTRACT

A wafer (or a circuit board), which is used to perform three-dimensional mounting, has protrusion 20 which is provided in low melting point metal 15 for electrically connecting mutually joined wafers 61 and 62, and which defines an interval between mutually joined wafers 61 and 62 without being deformed at the time when low melting point metal 15 is melted. A joining structure of wafers 61 and 62 is manufactured by using wafers 61 and 62, at least one of which has protrusion 20. In the manufactured joining structure of wafers 61 and 62, wafers 61 and 62 are electrically connected to each other by low melting point metal 15, and protrusion 20, which defines the interval between wafers 61 and 62 without being deformed at the time when low melting point metal 15 is melted, is provided in low melting point metal 15.

24 Claims, 13 Drawing Sheets

Fig. 10

|  | TERMINAL(1) | TERMINAL(2) | TERMINAL(3) | TERMINAL(4) |
|---|---|---|---|---|
| TERMINAL(1) | NO GOOD | NO GOOD | GOOD (a) | GOOD (d) |
| TERMINAL(2) | DUPLICATED | NO GOOD | GOOD (b) | GENERAL |
| TERMINAL(3) | DUPLICATED | DUPLICATED | GOOD (c) | GOOD (e) |
| TERMINAL(4) | DUPLICATED | DUPLICATED | DUPLICATED | GENERAL |

WAFER OF CIRCUIT BOARD AND JOINING STRUCTURE OF WAFER OR CIRCUIT BOARD

This application is based upon and claims the benefit of priority from Japanese patent application No. 2007-266716, filed on Oct. 12, 2007, the disclosure of which is incorporated herein in its entirety by reference.

BACKGROUND OF THE INVENTION

1. Field of the Invention

The present invention relates to a wafer or a circuit board, each of which is used to perform three-dimensional mounting by being joined to each other, and relates to a joining structure of the wafer or the circuit board.

2. Description of the Related Art

The thinning and miniaturization of an electronic apparatus have been achieved by the miniaturization of components mounted to the electronic apparatus. Conventionally, the miniaturization technique of the components has been largely dependent upon the microfabrication technology of LSI. However, enormous installation investment is required to introduce a finer microfabrication technology of LSI, and hence the introduction of such a technique cannot satisfy the need to reduce product costs. The problem can be solved in such a way that a through-electrode perpendicularly penetrating through the surface of a wafer (silicon and a compound semiconductor) is formed, that electrodes are formed on the front and rear surfaces of the wafer, and that the electrodes of each of the wafers are connected to each other by laminating the wafers. Accordingly, a technique to change conventional planar mounting (two-dimensional mounting) into spatial mounting (three-dimensional mounting) has been developed.

In Japanese Patent Laid-Open No. 11-204939, there is proposed, as a method for laminating the wafers, a method in which after bumps are formed on the wafers, the wafers, with an adhesive applied thereon, are stuck to each other. Further, in the patent document, there is disclosed a method in which metals on the surface, to which the adhesive is applied, are connected to each other by forcing out the adhesive from between the metals. In the patent document, tin-plated terminals, on which the adhesive is applied, are joined to each other while being pressed together. Thereby, the adhesive is forced out from between the metal joining portions, so that the metals are electrically connected to each other. However, a large force is required at the time of pressing the terminals together, and hence the method is unsuitable for minute bumps which are the object of the present invention.

In Japanese Patent Laid-Open No. 10-308415, there is described, as a method for connecting a solder protrusion to a connection electrode on a wiring board without using flux, a method of using a solder protrusion formed by a first protrusion and a second protrusion. In the patent document, a solder protrusion having a two-stage structure formed by the first protrusion and the second protrusion is formed such that the melting temperature of the first protrusion is higher than that of the second protrusion and that the surface area of the first protrusion is two times or more larger than the surface area of the second protrusion. In the method, the connection electrode on the wiring board and the solder protrusion are made to face each other, and are heated at a temperature which is equal to or lower than the melting temperature of the first protrusion and which is equal to or higher than the melting temperature of the second protrusion, while an electronic component is pressed. Since only the second protrusion is melted at the soldering temperature, the second protrusion can be expanded between the first protrusion and the connection electrode on the wiring board by the application of a slight pressing force. Thereby, as described in the patent document, the oxide film on the surface of the second protrusion is broken to expose the intrinsic layer in the second protrusion, so that a desired joining state can be obtained.

In Japanese Patent Laid-Open No. 2002-198485, there is described that first protrusion electrode 15 of first LSI chip 16 is a Sn-3.5Ag solder protrusion containing 96.5% of Tin (Sn) and 3.5% of silver (Ag), and that second protrusion electrode 19 is a protrusion made of nickel (Ni). Thus, second protrusion electrode 19 of second LSI chip 20, which has a small diameter and high hardness, is made to bite into first protrusion electrode 15 of first LSI chip 16, to allow bump 19 of second LSI chip 20 to break through the oxide film formed on the surface of first protrusion electrode 15 of first LSI chip 16, so that first LSI chip 16 and second LSI chip 19 are joined to each other. Thereby, as described in the patent document, there is obtained an advantage in which it is possible to realize a firm joining structure and possible to realize a semiconductor mounting assembly that has excellent temporal stability at high temperature. Further, as also described in the patent document, there is an advantage in which the melting point can be made low, and thereby the processing temperature for joining respective bumps can be set to a low level. However, the role of the protrusion is limited, as described above, and does not play the role of a spacer.

In Japanese Patent Laid-Open No. 2006-59957, there is described a method of using a protrusion, as a method of manufacturing a semiconductor package structure and a semiconductor package, and this method features excellent productivity, and a capability for making thinner and more miniaturized products, and has higher performance. However, the object of the protrusion is to break through a resin layer, and the protrusion does not play the role of a spacer. Further, a low melting point metal is not formed so as to cover the protrusion. Further, in the patent document, in addition to the above described protrusion, the followings are also disclosed about joining particles. The joining particles are arranged and joined at predetermined positions on the surface of a circuit conductor. The joining of the joining particles is performed by a method of ultrasonic welding, welding, soldering, applying a conductive resin, or the like. Then, the surface on which the joining particles are arranged, and a resin layer on which a conductor metal is provided, are arranged so as to face each other. By using a hot press apparatus, the resin layer on which the conductor metal is provided is heated at a predetermined temperature so as to be softened and then heat pressed. Thereby, the joining particles are embedded into the softened resin layer. When the resin layer is further heat pressed, the joining particles, and the conductor metal which is another conductor layer, are brought into contact and joined with each other.

In the case where conventional planar mounting (two-dimensional mounting) is changed into spatial mounting (three-dimensional mounting), it is difficult to fill an adhesive between respective layers, by the conventionally proposed method in which (1) the formation of a connection electrode, (2) lamination and connection, and (3) the filling of the adhesive between the layers, are performed in this order. In particular, when wafers that are used as an ideal form of the three-dimensional mounting are joined to each other, it is difficult to make the adhesive flow uniformly between the layers of wafers of eight inches or more.

On the other hand, it is difficult to control the heating and pressing conditions in the method in which an adhesive is applied to the surface of a metal and in which the metals are joined with each other by forcing out the adhesive from between the metals, that is, in the method in which (1) the formation of a connection electrode, (2) the application of adhesive, and (3) lamination and joining are performed in this order. That is, when the adhesive is applied beforehand between the layers of the wafers, and when the wafers are then heated and pressed, the joining portion is deformed, so that in some cases, the low melting point material used for the joining may be brought into contact with an adjacent joining portion.

SUMMARY

The present invention seeks to solve one or more of the above problems, or to improve upon those problems at least in part.

In order to achieve the above object, a wafer or a circuit board is used to perform three-dimensional mounting by being joined to each other, the wafer or the circuit board including:

a protrusion which is provided in the low melting point metal for mutually electrically connecting the mutually joined wafers or the mutually joined circuit boards, and which defines an interval between the mutually joined wafers or between the mutually joined circuit boards without being deformed at the time when the low melting point metal is melted.

Further, In order to achieve the above object, there is a provided a joining structure including wafers or circuit boards, which are three-dimensionally mounted by being joined to each other, wherein the mutually joined wafers or the mutually joined circuit boards are electrically connected to each other via the low melting point metal, and wherein a protrusion, which defines an interval between the mutually joined wafers or between the mutually joined circuit boards without being deformed at the time when the low melting point metal is melted, is provided in the low melting point metal.

BRIEF DESCRIPTION OF THE DRAWINGS

The above features and advantages of the present invention will be more apparent from the following description of certain preferred embodiments taken in conjunction with the accompanying drawings, in which:

FIG. 10 is a figure showing combinations (table) of the joining metal terminals;

DETAILED DESCRIPTION OF THE PREFERRED EMBODIMENTS

Figure 1A:
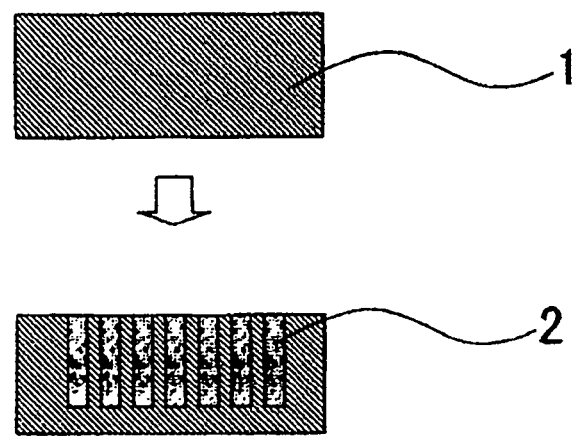
FIG. 1 is a figure showing a three-dimensional mounting process (No. 1)

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, exemplary embodiments will be described with reference to the accompanying drawings. Noted that in all the drawings, the same reference numerals denote the same portions, and hence a duplicate explanation will be omitted. Further, in order to facilitate explanation, the ratio between the respective portions is changed from the actual ratio.

Here, the invention will be described by taking three-dimensional mounting as an effective application example. In the following, exemplary embodiments of three-dimensional mounting of wafers will be described, but the same effect can also be obtained by using electronic circuit boards instead of wafers.

FIG. 1 to FIG. 4 show an outline of three-dimensional mounting processes.

[FIG. 1A]

Holes are formed by using a dry etching process for wafer 1 made of silicon or a compound semiconductor, and the side wall of the hole is insulated (this process is not shown). Then, conductor 2 made of a poly-silicon or a metal is filled in the hole. Here, different dimensions are used depending upon the semiconductor pre-process and a semiconductor element to be manufactured. However, in the case where DRAM (Dynamic Random Access Memory) is assumed to be manufactured, conductor 2 has a diameter of about 3 to 50 microns and a depth of about 20 to 100 microns. The interval between conductors 2 is about 20 to 100 microns. It is preferred that aluminum be arranged on conductor 2 so as to seal the conductor (not shown).

[FIG. 1B]

Insulating film 4 is formed in a region on the surface of wafer 1 in which conductors 2 are embedded, other than in the region where a terminal of conductor 2 is arranged. Wiring layer 3 is formed on insulating film 4 by using a semiconductor pre-process. The terminal of conductor 2 is connected to wiring 41 leading to a semiconductor element. Insulating film 4 is also formed on the surface of wiring layer 3.

[FIG. 2]

Joining metals 51 are formed. The details of this process are shown in FIG. 5 and FIG. 7. Joining metal 51 is connected to wiring 41 leading to the semiconductor element via pad 42 which is formed by a semiconductor process. Further, as shown in the enlarged view, insulating film 4 is formed in the peripheral portion of pad 42 which is formed by the semiconductor process.

[FIG. 3A]

Adhesive 6 is applied on joining metals 51 (in the figure, a state where joining metals 51 are mounted on interposer 8 is shown, and hence the upper and lower sides of joining metals 51 are shown in reversed position). Joining metals 52 are formed on interposer 8. Here, joining metals 52, which are formed on interposer 8, can also be formed on a wafer in which other elements are formed, by the same process. Further, in the process here, the formation of joining metals 52 is started from the portion on interposer 8, but can also be started from the portion on another wafer (that is, from a portion configured only by a wafer in which elements are formed, without using the interposer).

After being aligned, the joining portions are brought into contact with each other and heated at the same temperature or a temperature that is higher than the melting point of joining metal 51. At this time, adhesive 6 between joining metal 51 and joining metal 52 is forced out, so that joining metal 51 and joining metal 52 are connected to each other. Further, at this time, in the case where a thermosetting adhesive is used, the adhesive can be cured simultaneously with the time when joining metal 51 and joining metal 52 are connected to each other.

[FIG. 3B]

The surface opposite to the surface on the side of wiring layer 3 of wafer 1 in which semiconductor elements are formed, is polished to expose the terminal of conductor 2. Then, joining metals 52' are formed by the same process as that shown in FIG. 3A.

[FIG. 3C]

Figure 1B:
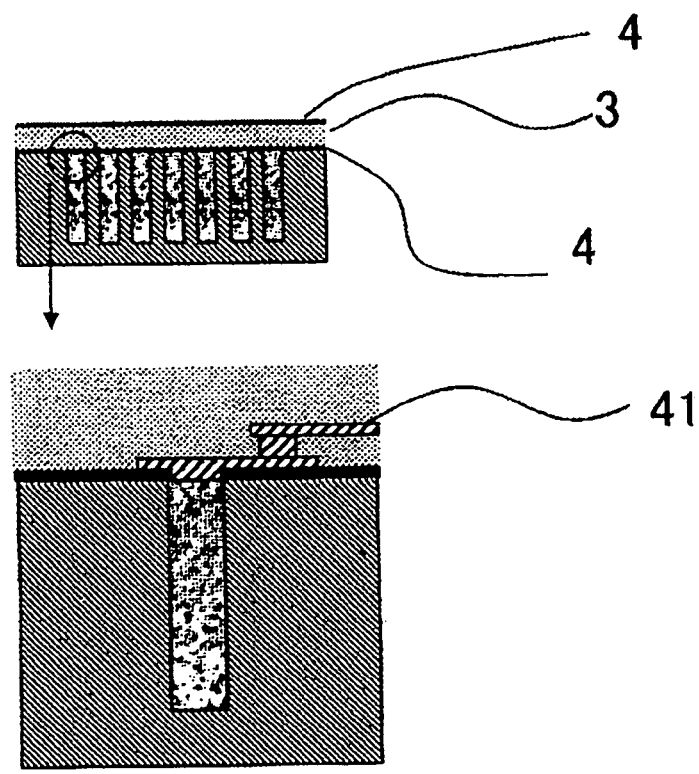
Figure 2:
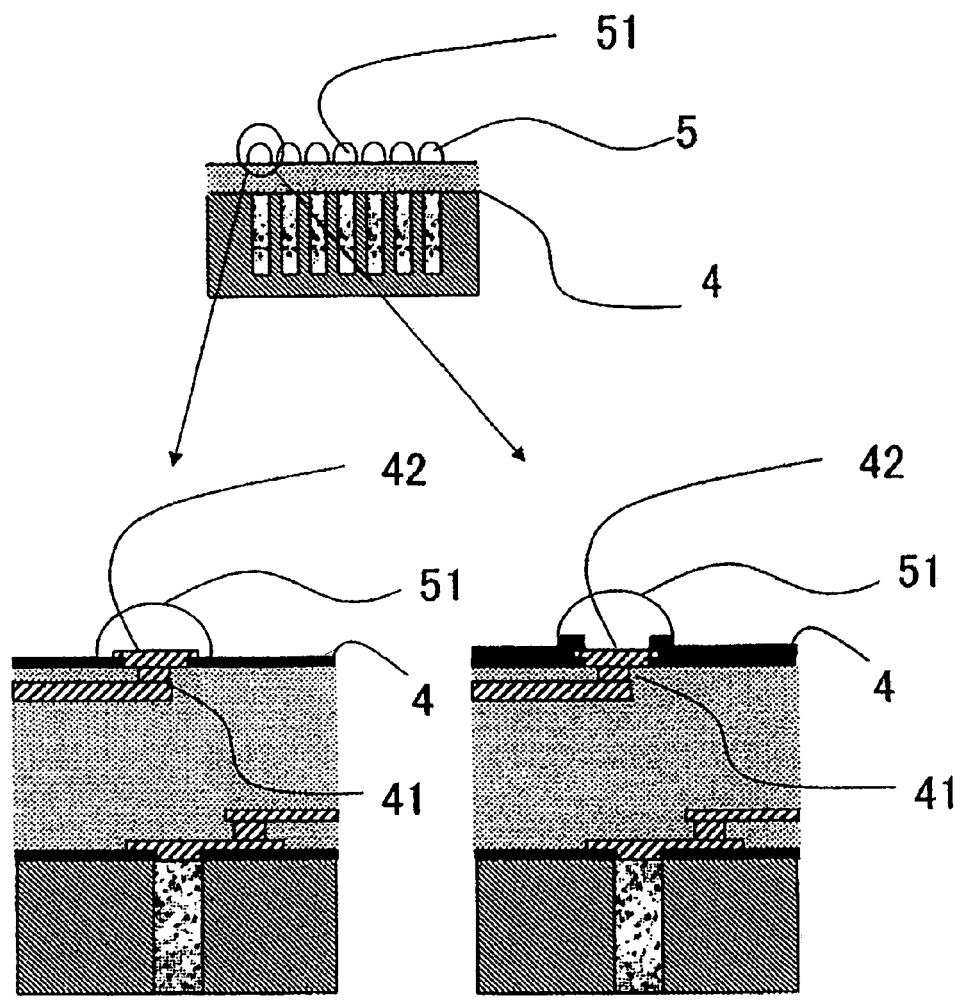
FIG. 2 is a figure showing a three-dimensional mounting process (No. 2)
Figure 3A:
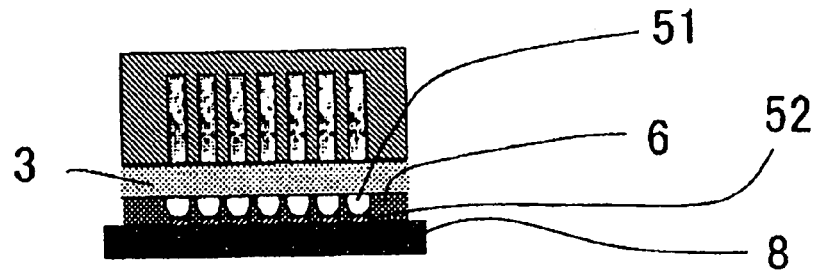
FIG. 3 is a figure showing a three-dimensional mounting process (No. 3)
Figure 3B:
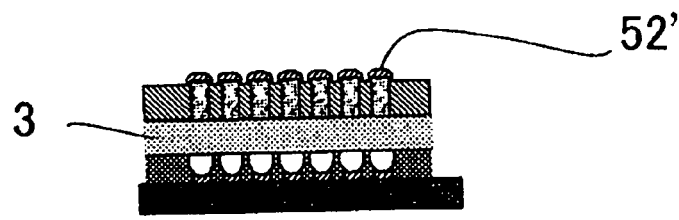
Figure 3C:
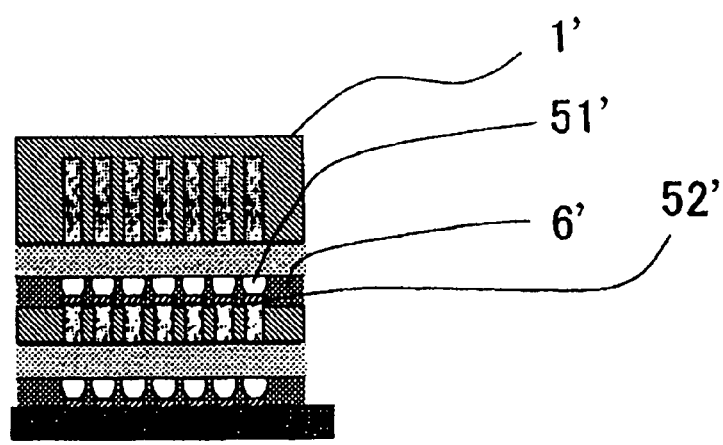

Another wafer 1' is produced by the process shown in FIG. 1 and FIG. 2 (the upper side and the lower side of the wafer are shown in reversed position in the figure), and adhesive 6' is applied on joining metal 51' of wafer 1'. After being aligned, the joining portions are brought into contact with each other and heated at the same temperature or a temperature that is higher than the melting point of joining metal 51'. At this time, adhesive 6' between joining metal 51' and joining metal 52' is forced out, so that joining metal 51' and joining metal 52' are connected to each other. Further, at this time, in the case where a thermosetting adhesive is used, the adhesive can be cured simultaneously with the time when joining metal 51' and joining metal 52' are connected to each other.

[FIG. 4A]

The surface opposite to the surface on the side of wiring layer 3' of wafer 1' in which wiring layer 3' is formed, is polished to expose the terminal of the conductor. Then, joining metals 52" are formed by the same process as that shown in FIG. 3A.

The above described processes are repeated, so that a wafer structure configured by laminating and connecting arbitrary number of sheets of wafers is manufactured.

[FIG. 4B]

Figure 4A:
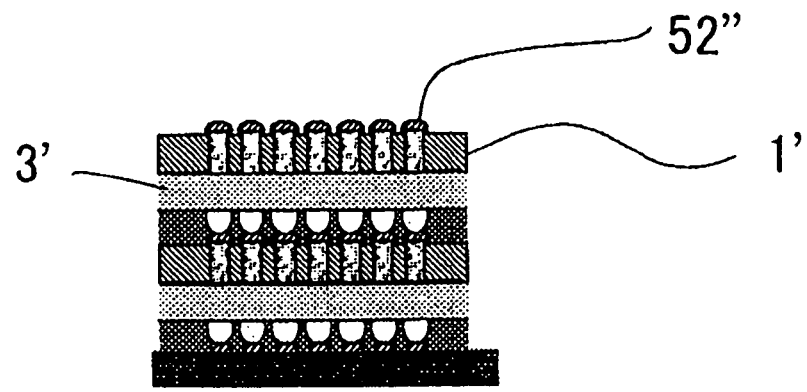
FIG. 4 is a figure showing a three-dimensional mounting process (No. 4)
Figure 4B:
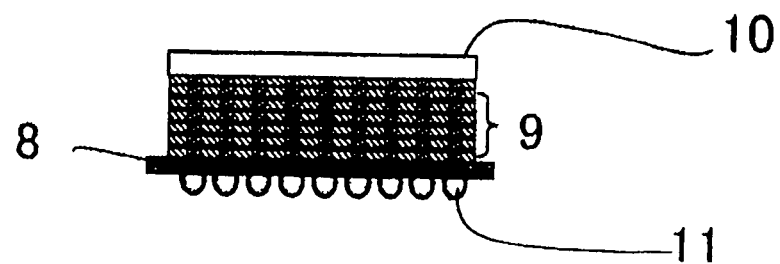

FIG. 4B is an overall view of a laminated semiconductor device according to the present exemplary embodiment. Laminated semiconductor elements 9 and chip 10 which controls semiconductor elements 9 are mounted on interposer 8. Here, control chip 10 is arranged on laminated semiconductor elements 9, but may be arranged at any place. For example, control chip 10 can also be arranged on interposer 8 or under interposer 8. Further, bumps 11 used for connection with an external circuit are formed under interposer 8.

FIG. 5 and FIG. 7 respectively show forming methods of joining together metal terminals of the exemplary embodiments according to the present invention. Further, FIG. 6 and FIG. 8 respectively show manufacturing methods of joining together metal terminals which are connected to the joining metal terminals of the present exemplary embodiments formed by the methods shown in FIG. 5 and FIG. 7.

FIG. 5 shows a method of forming joining metal terminal (1) of exemplary embodiment 1 according to the present invention. A protrusion which plays the role of a spacer is formed in the joining metal terminal of the present exemplary embodiment.

[FIG. 5A]

Power feeding film 12 for electroplating, which is made of multilayer films made of titanium 13 (50 nanometer)/copper 14 (0.5 micrometer), is formed on wafer 1. The function of titanium here is to mutually join copper and a base board, which are located on the upper and lower sides of titanium, in a desired state (the base board is shown as wafer 1 in the figure, but in an actual semiconductor element, is $SiO_2$, SiN or polyimide, formed on the surface of the wafer). Thus, the film thickness of titanium may be the minimum film thickness required to ensure that copper and the base board remain joined together. The required film thickness is changed due to conditions of sputter etching and spattering, the film quality of titanium, and the like. Note that a chromium film can also be used instead of the titanium film used in the present exemplary embodiment.

On the other hand, the film thickness of copper is preferably set to the minimum film thickness set to a minimum film thickness which prevent an increase in the film thickness distribution at the time when electroplating is performed in the subsequent process. The film thickness at which the film thickness distribution is prevented from being induced, is determined in consideration of an amount of the film corroded in pickling, and the like, performed as a pretreatment of the plating, and the like. When the film thickness of copper is made thicker than needed, and, for example, when the film thickness exceeds 1 micrometer, the sputtering time is increased, so as to lower the production efficiency. Further, in addition to this problem, etching needs to be performed for a long time at the time when power feeding film 12 is removed by etching in the subsequent process. As a result, the side etching of copper 14 under the nickel is increased.

[FIG. 5B]

A pattern of a protrusion is formed at the position where the metal terminal is joined together by using resist 7.

[FIG. 5C]

Protrusion 20 is formed by using electroplating. As a material of electroplating, it is possible to use gold, silver, copper, nickel, and the like, but copper, on the surface of which a plating film is easily formed in the subsequent process, is used.

[FIG. 5D]

Figure 5A:
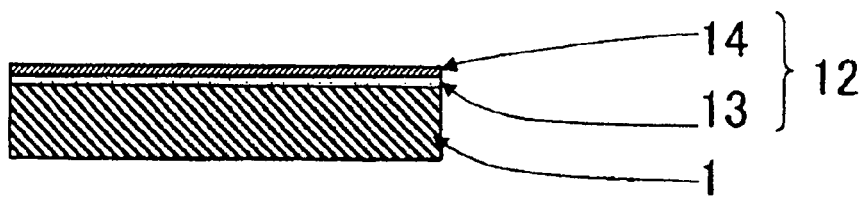
FIG. 5 is a figure showing a method for forming a joining metal terminal (1)
Figure 5B:
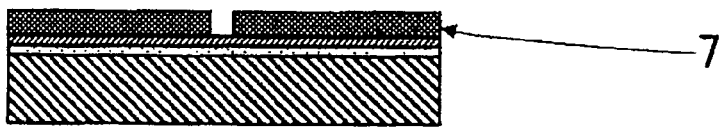
Figure 5C:
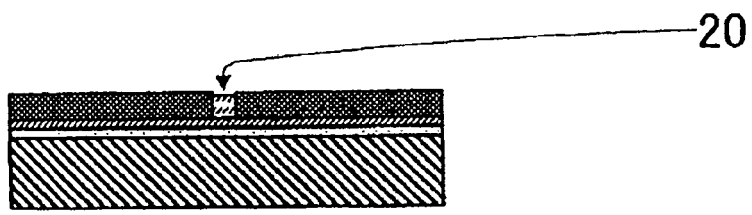

The resist formed in FIG. 5B is peeled one time. Then, the resist is again applied and patterned, so that a pattern of the joining metal terminal is formed. Any peeling agent can be used here, as long as the agent dissolves the resist and does not remarkably dissolve the formed member.

[FIG. 5E]

Figure 5D:
Figure 5E:
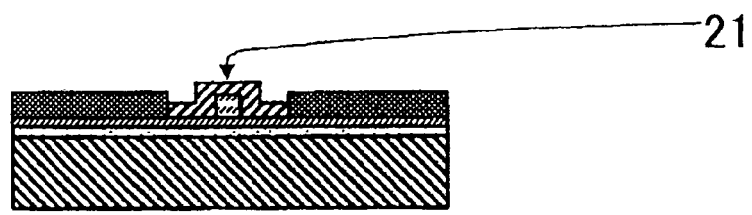
Figure 5F:
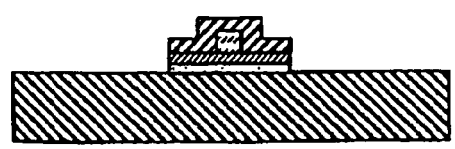

Nickel 21 is formed in the pattern formed in FIG. 5D by using electro-nickel plating. Here, pure nickel is used, but a material in which a trace of silver and copper is mixed into nickel, may also be used in order to improve wettability with a low melting point material. Further, copper can also be used as a material forming the joining metal terminal, but nickel is preferably used for securing the reliability.

[FIG. 5F]

The resist formed in FIG. 5D is peeled. Any peeling agent can be used here, as long as the agent dissolves the resist and does not remarkably dissolve the formed member. Subsequently, power feeding film 12 formed in FIG. 5A is removed by etching. Etching solutions, such as a ferric chloride etching solution and an alkali based etching solution, can be used for etching copper 14, but in the present exemplary embodiment, an alkali based etching solution containing ammonia is used. In the etching here, when the time period during which the etching is performed is shorter than ten seconds, the etching is disadvantageous from a practical viewpoint because of the difficulty in controlling the etching. However, in the case where the time period of etching is excessively long, for example, when the time period of etching exceeds five minutes, there are also caused problems in which the side etching is increased and in which the tact time is increased. Therefore, it is preferred that the etching solution and the etching conditions are suitably determined by experiment. An etching solution using hydrogen peroxide as a main component is used for the subsequently performed etching of the portion of titanium 13 of the power feeding film. In any of the etching processes, any etching solution can be used, as long as the solution does not remarkably dissolve the formed member. Further, when chromium is used for power feeding film 12, a mixed solution of potassium permanganate and sodium metasilicate is used.

Figure 6A:
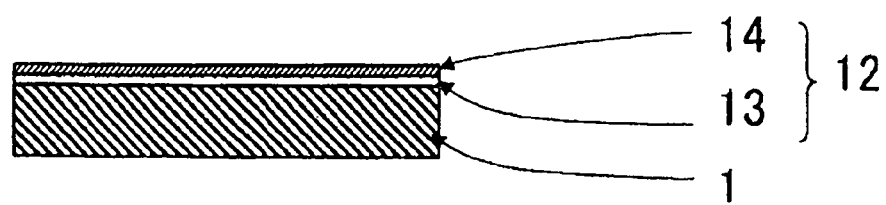
FIG. 6 is a figure showing a method for forming a joining metal terminal (2)
Figure 6B:
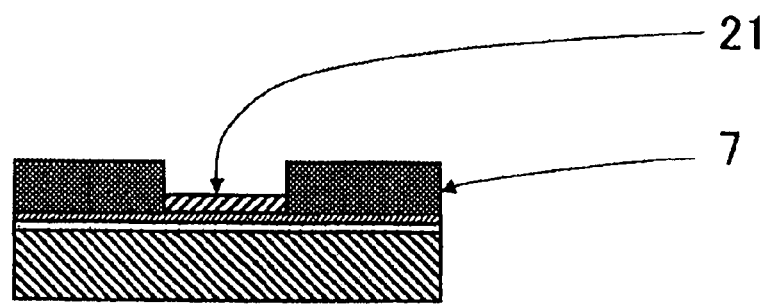
Figure 6C:
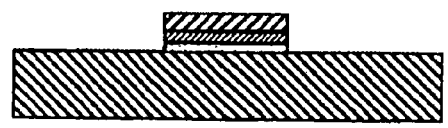

FIG. 6 shows a method of forming joining metal terminal (2) connected to the joining metal terminal of the exemplary embodiment according to the present invention.

[FIG. 6A]

Power feeding film 12 for electroplating, which is made of multilayer films made of titanium 13 (50 nanometer)/copper 14 (0.5 micrometer), is formed on wafer 1. The function of titanium here is to mutually join copper and a base board, which are located on the upper and lower sides of titanium, in a desired state (the base board is shown as wafer 1 in the figure, but in an actual semiconductor element, is $SiO_2$, SiN or polyimide, formed on the surface of the wafer). Thus, the film thickness of titanium may be the minimum film thickness required to ensure that copper and the base board remain joined together. The required film thickness is changed due to conditions of sputter etching and spattering, the film quality of titanium, and the like. Note that chromium film can also be used instead of the titanium film used in the present exemplary embodiment.

On the other hand, the film thickness of copper is preferably set to a minimum film thickness which prevent an increase in the film thickness distribution at the time when electroplating is performed in the subsequent process. The film thickness at which the film thickness distribution is prevented from being induced, is determined in consideration of an amount of the film corroded in pickling, and the like, performed as a pretreatment of the plating, and the like. When the film thickness of copper is made thicker than needed, and, for example, when the film thickness exceeds 1 micrometer, the sputtering time is increased, which lowers production efficiency. Further, in addition to this problem, etching needs to be performed for a long time at the time when power feeding film 12 is removed by etching in the subsequent process. As a result, side etching of copper 14 under the nickel is increased.

[FIG. 6B]

A pattern of a joining metal is formed by using resist 7, and the joining metal is formed by using electroplating. Here, copper can also be used, but nickel 21 is preferably used for securing reliability. Further, a material in which a trace of silver and copper is mixed into nickel, may also be used in order to improve wettability with a low melting point material.

[FIG. 6C]

The resist formed in FIG. 6B is peeled. Any peeling agent can be used here, as long as the agent dissolves the resist and does not remarkably dissolve the formed member. Subsequently, power feeding film 12 formed in FIG. 6A is removed by etching. Etching solutions, such as a ferric chloride etching solution and an alkali based etching solution, can be used for etching copper 14, but in the present exemplary embodiment, an alkali based etching solution containing ammonia is used. In the etching here, when the time period during which the etching is performed is shorter than ten seconds, the etching is disadvantageous from a practical viewpoint because of the difficulty in controlling the etching. However, in the case where the time period of etching is excessively long, for example, when the time period of etching exceeds five minutes, there are also caused problems in which the side etching is increased and in which the tact time is increased. Therefore, it is preferred that the etching solution and the etching condition be suitably determined by experiment. An etching solution using hydrogen peroxide as a main component is used for the subsequently performed etching of the portion of titanium 13 of the power feeding film. In any of the etching processes, any etching solution can be used, as long as the solution does not remarkably dissolve the formed member. Further, when chromium is used for power feeding film 12, a mixed solution of potassium permanganate and sodium metasilicate is used.

FIG. 7 shows a method of forming joining metal terminal (3) of exemplary embodiment 2 according to the present invention. In the present exemplary embodiment, there are formed a protrusion which plays the role of a spacer, and a low melting point metal (tin in the exemplary embodiment) for electrically connecting wafers to each other.

[FIG. 7A]

Power feeding film 12 for electroplating, which is made of multilayer films made of titanium 13 (50 nanometer)/copper 14 (0.5 micrometer), is formed on wafer 1. The function of titanium here is to mutually join copper and a base board, which are located on the upper and lower sides of titanium, in a desired state (the base board is shown as wafer 1 in the figure, but in an actual semiconductor element, is $SiO_2$, SiN or polyimide, formed on the surface of the wafer). Thus, the film thickness of titanium may be the minimum film thickness required to ensure that copper and the base board remain joined together. The required film thickness is changed due to conditions of sputter etching and spattering, the film quality of titanium, and the like. Note that a chromium film can also be used instead of the titanium film used in the present exemplary embodiment.

On the other hand, the film thickness of copper is preferably set to a minimum film thickness which prevent an increase in the film thickness distribution at the time when electroplating is performed in the subsequent process. The film thickness at which the film thickness distribution is prevented from being induced, is determined in consideration of an amount of the film corroded in pickling, and the like, performed as a pretreatment of the plating, and the like. When the film thickness of copper is made thicker than needed, and, for example, when the film thickness exceeds 1 micrometer, the sputtering time is increased, which lowers the production efficiency. Further, in addition to this problem, etching needs to be performed for a long time at the time when power feeding film 12 is removed by etching in the subsequent process. As a result, the side etching of copper 14 under nickel is increased.

[FIG. 7B]

A pattern of a protrusion is formed at the position of the joining metal terminal by using resist 7.

[FIG. 7C]

Protrusion 20 is formed by using electroplating. As a material of electroplating, it is possible to use gold, silver, copper, nickel, and the like, but copper, on the surface of which a plating film is easily formed in the subsequent process, is used.

[FIG. 7D]

Figure 7A:
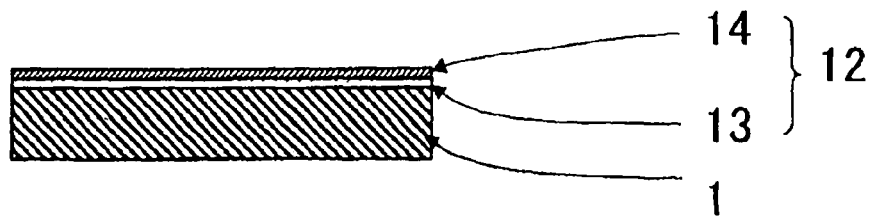
FIG. 7 is a figure showing a method for forming a joining metal terminal (3)
Figure 7B:
Figure 7C:
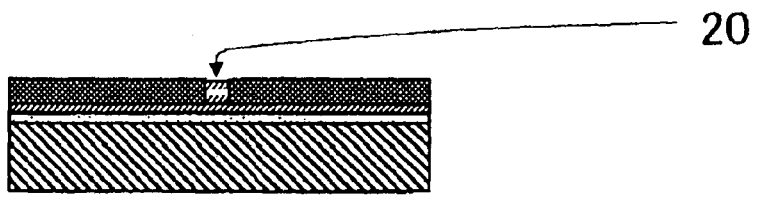

The resist formed in FIG. 7B is peeled one time. Then, the resist is again applied and patterned, so that a pattern of the joining metal terminal is formed. Any peeling agent can be used here, as long as the agent dissolves the resist and does not remarkably dissolve the formed member.

[FIG. 7E]

Figure 7D:
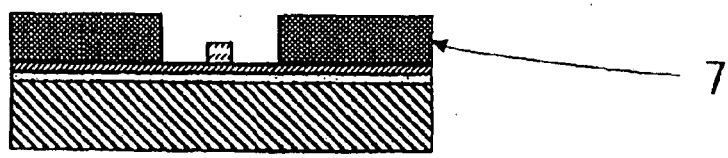
Figure 7E:
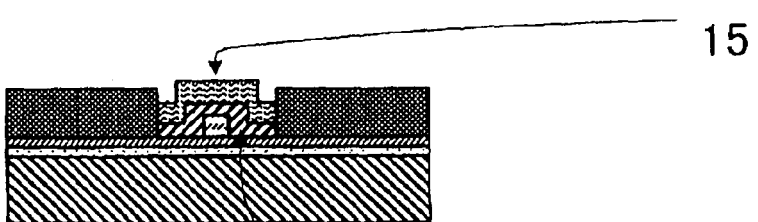
Figure 7F:
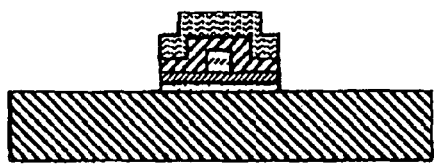
Figure 7G:
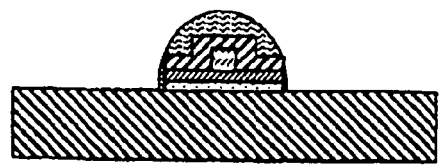

Nickel 21 is formed in the pattern formed in FIG. 7D by using electro-nickel plating. Here, pure nickel is used, but a material in which a trace of silver and copper is mixed into nickel, may also be used in order to improve wettability with a low melting point material. Further, copper can also be used as a material for forming the joining metal terminal, but nickel 21 is preferably used for securing reliability. Further, tin 15 is formed on nickel 21 by using electroplating. Here, pure tin is used, but any material such as a tin silver plated material and a tin silver copper plated material can be used, as long as tin is used as a main component in the material.

[FIG. 7F]

The resist formed in FIG. 7D is peeled. Any peeling agent can be used here, as long as the agent dissolves the resist and does not remarkably dissolve the formed member. Subsequently, power feeding film 12 formed in FIG. 7A is removed by etching. Etching solutions, such as a ferric chloride etching solution and an alkali based etching solution, can be used for etching copper 14, but in the present exemplary embodiment, an alkali based etching solution containing ammonia is used. In the etching here, when the time period during which the etching is performed is shorter than ten seconds, etching is disadvantageous from a practical viewpoint because of the difficulty in controlling the etching. However, in the case where the time period of etching is excessively long, for example, when the time period of etching exceeds five minutes, there are also caused problems in which the side etching is increased and in which the tact time is increased. Therefore, it is preferred that the etching solution and the etching condition be suitably determined by experiment. An etching solution using hydrogen peroxide as a main component is used for the subsequently performed etching of the portion of titanium 13 of the power feeding film. In any of the etching processes, any etching solution can be used, as long as the solution does not remarkably dissolve the formed member. Further, when chromium is used for power feeding film 12, a mixed solution of potassium permanganate and sodium metasilicate is used.

[FIG. 7G]

Tin is heated to its melting point temperature or higher, so as to be formed into a spherical shape.

FIG. 8 shows a method of forming joining metal terminal (4) connected to the joining metal terminal of the exemplary embodiment according to the present invention.

[FIG. 8A]

Power feeding film 12 for electroplating, which is made of multilayer films made of titanium 13 (50 nanometer)/copper 14 (0.5 micrometer), is formed on wafer 1. The function of titanium here is to mutually join copper and a base board, which are located on the upper and lower sides of titanium, in a desired state (the base board is shown as wafer 1 in the figure, but in an actual semiconductor element, is $SiO_2$, SiN or polyimide). Thus, the film thickness of titanium may be the minimum film thickness required to ensure that copper and the base board remain joined together. The required film thickness is changed due to conditions of sputter etching and spattering, the film quality of titanium, and the like. Note that a chromium film can also be used instead of the titanium film used in the present exemplary embodiment.

On the other hand, the film thickness of copper is preferably set to a minimum film thickness which prevent an increase in the film thickness distribution at the time when electroplating is performed in the subsequent process. The film thickness at which the film thickness distribution is prevented from being induced, is determined in consideration of an amount of the film corroded in pickling, and the like, performed as a pretreatment of the plating, and the like. When the film thickness of copper is made thicker than needed, and, for example, when the film thickness exceeds 1 micrometer, the sputtering time is increased, so as to lower the production efficiency. Further, in addition to this problem, etching needs to be performed for a long time at the time when power feeding film 12 is removed by etching in the subsequent process. As a result, side etching of copper 14 under the nickel is increased.

[FIG. 8B]

A pattern of a joining metal is formed by using resist 7, and the joining metal is formed by using electroplating. Here, pure nickel is used, but a material in which a trace of silver and copper is mixed into nickel, may also be used in order to improve wettability with a low melting point material. Further, copper can also be used as a material for forming the joining metal terminal, but nickel 21 is preferably used for securing the reliability.

[FIG. 8C]

Further, tin 15 is formed on nickel 21 by using electroplating. Here, pure tin is used, but any material such as a tin silver plated material and a tin silver copper plated material can be used, as long as tin is used as a main component in the material.

[FIG. 8D]

Figure 8A:
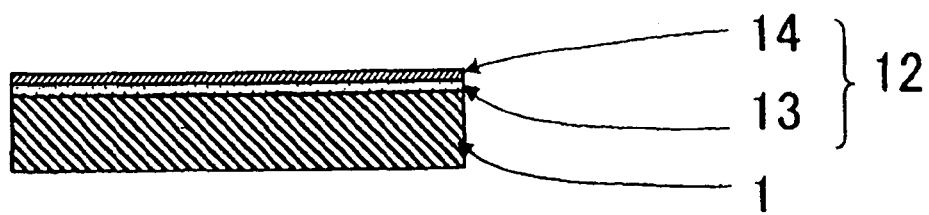
FIG. 8 is a figure showing a method for forming a joining metal terminal (4)
Figure 8B:
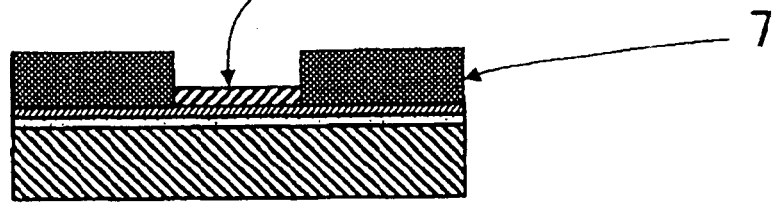
Figure 8C:
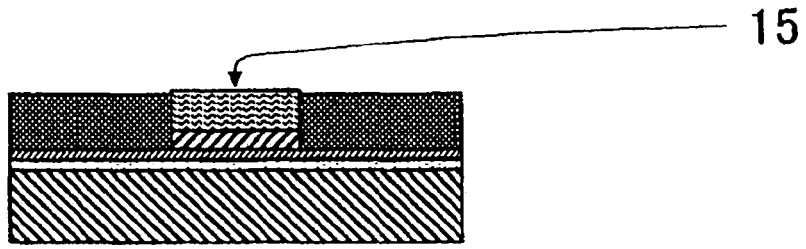
Figure 8D:
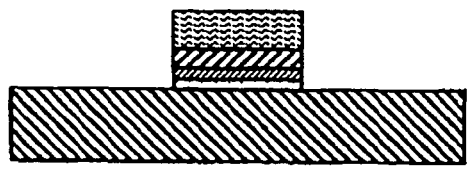
Figure 8E:
Figure 9A:
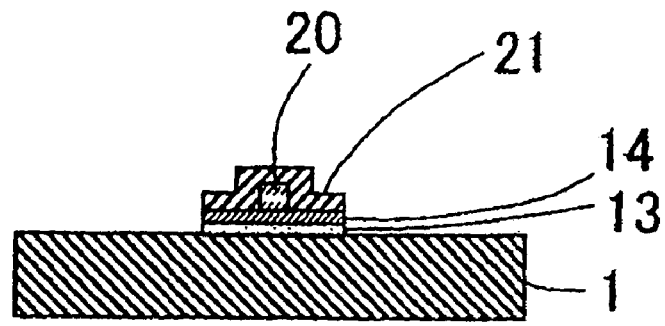
FIG. 9 is a figure showing a joining metal terminal.
Figure 9B:
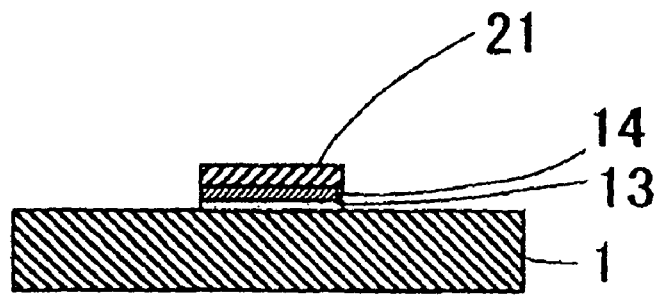
Figure 9C:
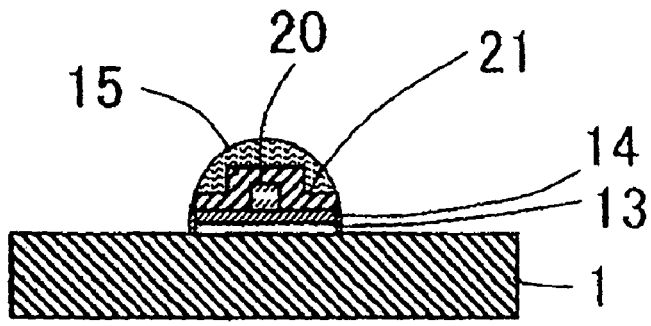
Figure 9D:
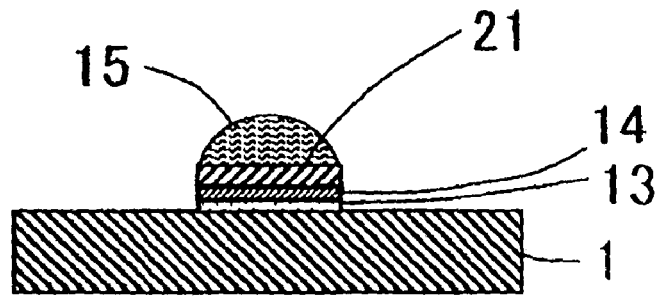

The resist formed in FIG. 8B is peeled. Any peeling agent can be used here, as long as the agent dissolves the resist and does not remarkably dissolve the formed member. Subsequently, power feeding film 12 formed in FIG. 8A is removed by etching. Etching solutions, such as a ferric chloride etching solution and an alkali based etching solution, can be used for etching copper 14, but in the present exemplary embodiment, an alkali based etching solution containing ammonia is used. In the etching here, when the time period during which the etching is performed is shorter than ten seconds, the etching is disadvantageous from a practical viewpoint because of the difficulty in controlling the etching. However, in the case where the time period of etching is excessively long, for example, when the time period of etching exceeds five minutes, there are also caused problems in which the side etching is increased and in which the tact time is increased. Therefore, it is preferred that the etching solution and the etching condition be suitably determined by experiment. An etching solution using hydrogen peroxide as a main component is used for the subsequently performed etching of the portion of titanium 13 of the power feeding film. In any of the etching processes, any etching solution can be used here, as long as the solution does not remarkably dissolve the formed member. Further, when chromium is used for power feeding film 12, a mixed solution of potassium permanganate and sodium metasilicate is used.

[FIG. 8E]

Tin is heated to its melting point temperature or to a higher temperature so as to be formed into a spherical shape.

FIG. 9 shows configurations of the joining metal terminals formed as shown in FIG. 5 to FIG. 8. Joining metal terminal (1) shown in FIG. 9A is the joining metal terminal of exemplary embodiment 1 according to the present invention. Joining metal terminal (3) shown in FIG. 9C is the joining metal terminal of exemplary embodiment 2 according to the present invention. Joining metal terminal (2) shown in FIG. 9B is the joining metal terminal to be joined to joining metal terminal (1) shown in FIG. 9A. Joining metal terminal (4) shown in FIG. 9D is the joining metal terminal to be joined to joining metal terminal (3) shown in FIG. 9C.

In FIG. 9, reference numeral 1 denotes a wafer. Reference numeral 13 denotes titanium, and reference numeral 14 denotes copper. Titanium 13 and copper 14 are the power feeding films for electroplating. Reference numeral 20 denotes a protrusion. Protrusion 20 is formed in a low melting point metal (tin in the exemplary embodiment) which electrically connects wafers to each other at the time when the wafers are joined to each other. Protrusion 20 is not deformed at the time when the low melting point metal is melted, so as to define an interval between the wafers. In the exemplary embodiment according to the present invention, copper is used as the material of protrusion 20, but a metal, such as gold, silver and nickel may also be used. Reference numeral 21 denotes a metal used as a barrier for the low melting point metal, and nickel is used in the exemplary embodiment according to the present invention. Instead of nickel, an alloy containing 90% or more of nickel, in which a trace of silver and copper is mixed, may also be used in order to improve wettability with the low melting point metal. It is possible to prevent diffusion of the low melting point metal by nickel 21. Reference numeral 15 denotes the low melting point metal which is provided for electrically connecting the wafers to each other and which melts at a temperature of 400° C. or lower. Tin is used in the exemplary embodiment according to the present invention. In addition to pure tin, an alloy containing 90% or more of tin, such as tin silver and tin silver copper, may also be used.

As for the size of the joining metal terminal shown in FIG. 9A to FIG. 9D, the diameter is 3 to 250 μm and the height is 3 to 250 μm. Preferably, the diameter is 3 to 50 μm and the height is 3 to 50 μm.

FIG. 10 shows a table representing combinations at the time when these joining metal terminals are used so that they can be joined to each other. Here, the combination indicated by the mark "NO GOOD" is a combination in which the terminals cannot be joined to each other because the low melting point metal (tin or tin alloy) is not formed in each of the terminals. The combination indicated by the mark "DUPLICATED" is a duplicated combination. The combination indicated by the mark "GENERAL" is a combination generally used for the joining of metals to each other. The combination indicated by the mark "GOOD" is a combination of the joining metal terminals that are joined to each other and which feature the exemplary embodiment according to the present invention, and in at least one of which the protrusion is formed. Further, reference characters (a) to (f) shown in the table correspond to the joining structures as will be described with reference to FIG. 11.

FIG. 11 shows the joining structures. In the figure, only the portions of copper, tin and nickel are shown, and detailed portions of the conductor, and the like, in the wafer are not shown. Further, although not shown, an underfill material (adhesive) is filled between the wafer layers.

Figure 11A:
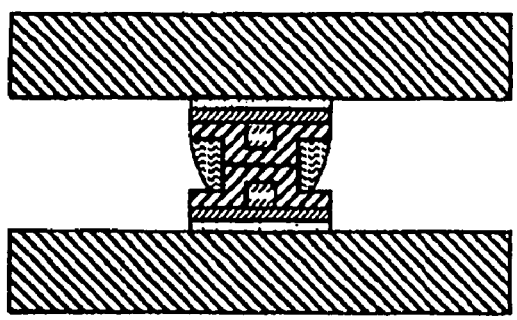
FIG. 11 is a figure showing combinations (joining structures) that are used to join metal terminals together.

FIG. 11A shows a joining structure (a) in which joining metal terminal (1) having the protrusion is joined with joining metal terminal (3) having the protrusion and the low melting point metal. The wafers are electrically connected to each other by the low melting point metal of joining metal terminal (3). The interval between the wafers is defined by the protrusion of joining metal terminal (1) and the protrusion of joining metal terminal (3).

Figure 11B:
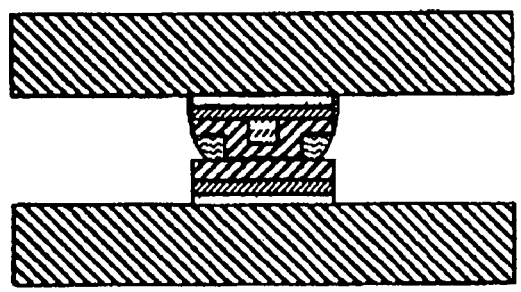

FIG. 11B shows a joining structure (b) in which joining metal terminal (2) is joined with joining metal terminal (3) having the protrusion and the low melting point metal. The wafers are electrically connected to each other by the low melting point metal of joining metal terminal (3). The interval between the wafers is defined by the protrusion of joining metal terminal (3).

Figure 11C:
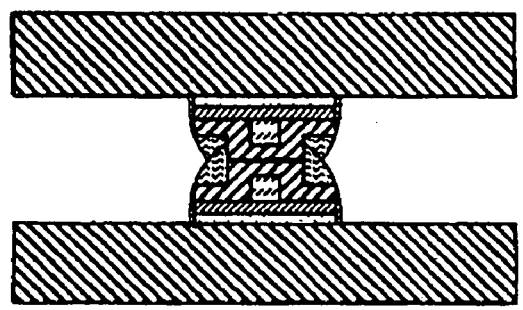

FIG. 11C shows joining structure (c) in which joining metal terminals (3) having the protrusion and the low melting point metal are joined with each other. The wafers are electrically connected to each other by the low melting point metal of both joining metal terminals (3). The interval between the wafers is defined by the protrusion of both joining metal terminals (3).

Figure 11D:
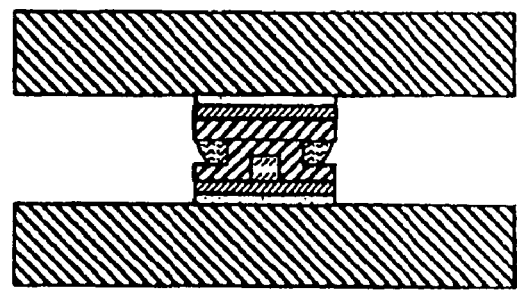

FIG. 11D shows joining structure (d) in which joining metal terminal (1) having the protrusion is joined with joining metal terminal (4) having the low melting point metal. The wafers are electrically connected to each other by the low melting point metal of joining metal terminal (4). The interval between the wafers is defined by the protrusion of joining metal terminal (1).

Figure 11E:
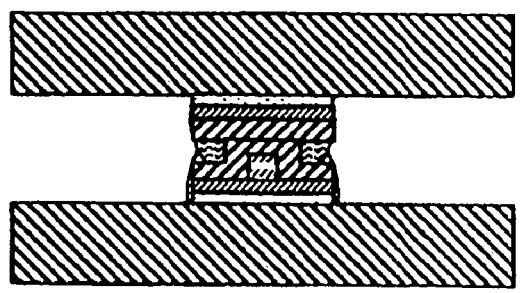

FIG. 11E shows joining structure (e) in which joining metal terminal (3) having the protrusion and the low melting point metal is joined with joining metal terminal (4) having the low melting point metal. The wafers are electrically connected to each other by the low melting point metal of joining metal terminal (3) and the low melting point metal of joining metal terminal (4). The interval between the wafers is defined by the protrusion of joining metal terminal (3).

Figure 12A:
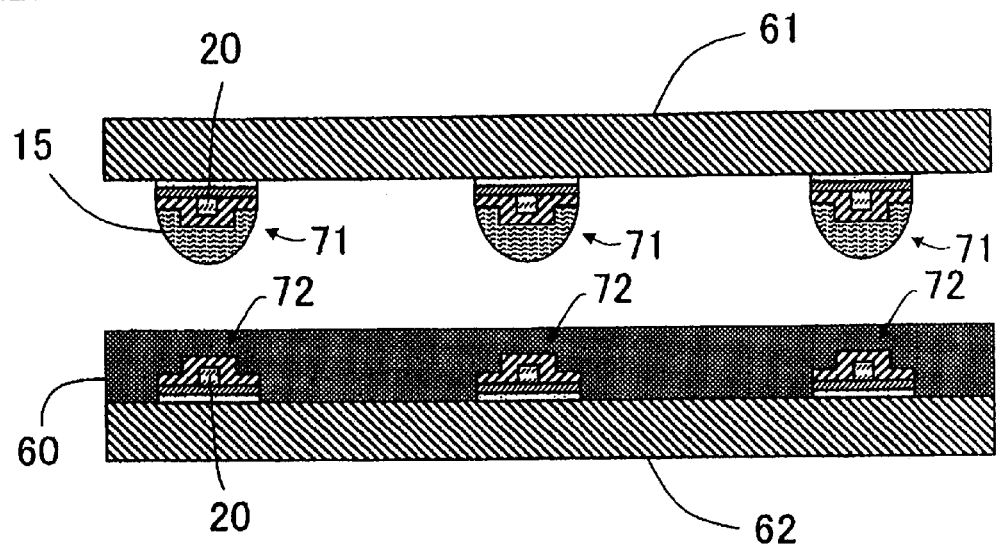
FIG. 12 is a figure showing a method for manufacturing a joining structure (a) of wafers.
Figure 12B:
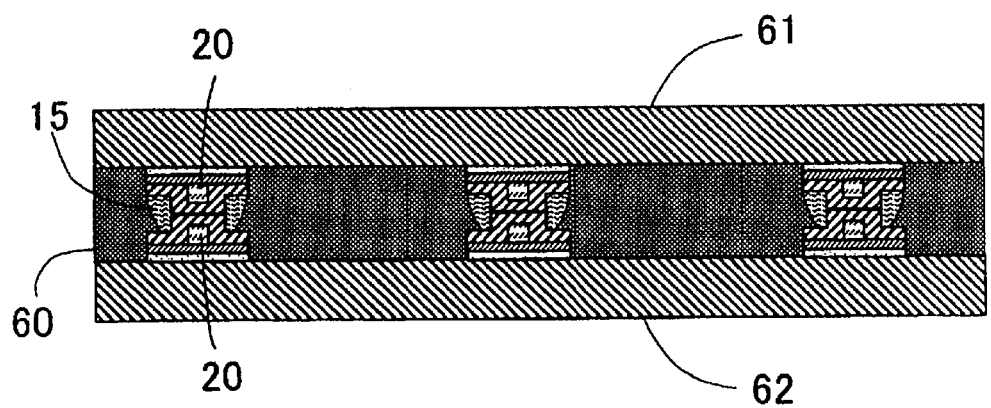

FIG. 12 shows a manufacturing method of the joining structure (a) of the wafers in the case where the combination of the joining metal terminals shown in FIG. 11A is used. FIG. 12A shows a state just before the wafers are joined. FIG. 12B shows the joining structure (a) after the wafers are joined to each other. Reference numerals 61 and 62 denote two wafers to be joined. Reference numeral 71 denotes joining metal terminal (3) of exemplary embodiment 2 according to the present invention. Reference numeral 72 denotes joining metal terminal (1) of exemplary embodiment 1 according to the present invention. Reference numeral 60 denotes an adhesive.

As shown in FIG. 12A, joining metal terminal (3) 71 is formed on wafer 61, and joining metal terminal (1) 72 is formed on wafer 62. Joining metal terminal (3) 71 formed on wafer 61 has protrusion 20 and low melting point metal 15. Joining metal terminal (1) 72 formed on wafer 62 has protrusion 20. That is, FIG. 12 shows the case where the joining metal terminal of each of the wafers has the protrusion. Adhesive 60 is applied to the surface of wafer 62, which faces wafer 61. Note that adhesive 60 may also be applied on wafer 61.

As shown in FIG. 12B, after being aligned to each other, the wafers are brought into contact and joined with each other by being heated to the temperature of the melting point of low melting point metal 15 (tin in the exemplary embodiment) of joining metal terminal (3) 71 or to a higher temperature. At this time, adhesive 60 between joining metal terminal (3) 71 and joining metal terminal (1) 72 is pressed away, so that joining metal terminal (3) 71 and joining metal terminal (1) 72 are electrically connect to each other by low melting point metal 15. Note that in the present exemplary embodiment, protrusion 20 is made of copper, and hence protrusion 20 also contributes to the electrical connection. At this time, when a thermosetting adhesive is used, adhesive 60 can be cured simultaneously with the connection. In this way, the joining structure of the wafer in which protrusion 20 is formed in low melting point metal 15, is produced.

The interval between the wafers is defined by protrusion 20 of joining metal terminal (3) 71 and protrusion 20 of joining metal terminal (1) 72. Since protrusions 20 are provided, the wafers can be joined to each other without adhesive 60 applied on the joining metal terminals being held between the joining metal terminals. Thereby, the electrical connection can be obtained between the electrode portions. Since protrusions 20 are not deformed at this time, it is possible to fix the interval between the wafers.

In the case of the conventional joining metal terminal without the protrusion, when the wafers are heated and joined to each other, problems are caused in which the low melting point metal is deformed and thereby an appropriate interval between the wafers cannot be maintained, and in which the adhesive is held between the joining metal terminals and thereby the electrical connection cannot be obtained. Such problems are caused in particular when the size of the joining metal terminal is small.

On the other hand, the joining metal terminal of the exemplary embodiment according to the present invention has protrusion 20, and hence the interval between the wafers is defined by protrusion 20. Further, even when low melting point metal 15 is melted, protrusion 20 in low melting point metal 15 is not deformed. Thus, it is possible to obtain the electrical connection without adhesive 60 being held between joining metal terminals. Since protrusion 20 is not deformed, the wafers can be pressed together by a strong force when being joined to each other, and also the pressing force need not be adjusted. Further, the pressing force is concentrated on protrusion 20 when the wafers are pressed together, and adhesive 60 can be effectively forced out from between the wafers.

Note that in FIG. 12, the portion of the joining interface between two wafers is enlarged and emphasized, and the configuration in the wafer and the configuration on the surface of the opposite side of the wafer are not shown. Further, in FIG. 12, three joining metal terminals are provided for each wafer, but many joining metal terminals are actually provided for each wafer. Joining metal terminal (3) 71 and joining metal terminal (1) 72 shown in FIG. 12 respectively correspond to joining metal 51' and joining metal 52' shown in FIG. 3C.

Figure 13A:
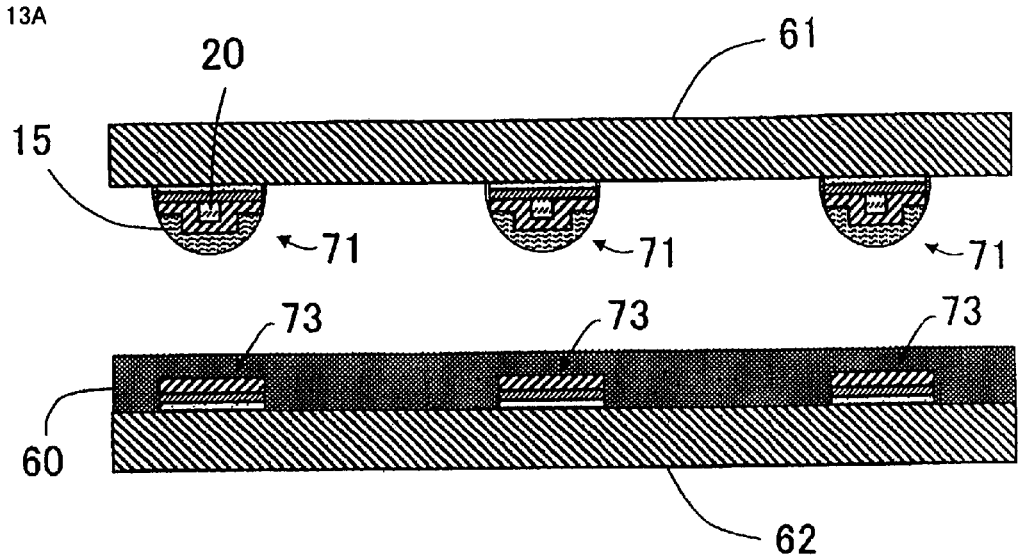
FIG. 13 is a figure showing a method for manufacturing a joining structure (b) of wafers.
Figure 13B:
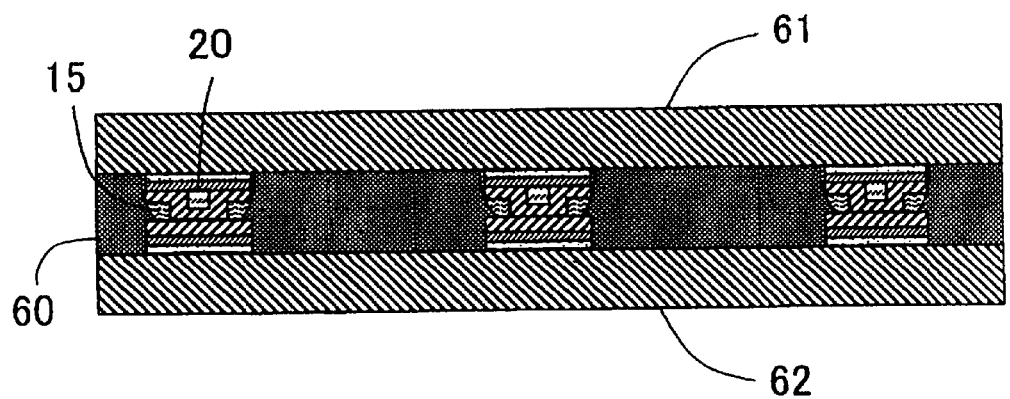

FIG. 13 shows a method of manufacturing the joining structure (b) of the wafers in the case where a combination of the joining metal terminals shown in FIG. 11B is used. FIG. 13A shows a state just before the wafers are joined. FIG. 13B shows a state after the wafers are joined to each other. Reference numerals 61 and 62 denote two wafers to be joined. Reference numeral 71 denotes joining metal terminal (3) of exemplary embodiment 2 according to the present invention. Reference numeral 73 denotes joining metal terminal (2). Reference numeral 60 denotes an adhesive.

FIG. 13 is different from FIG. 12 only in that joining metal terminal (2) 73 is provided on wafer 62 instead of joining metal terminal (1) 72 in FIG. 12. That is, in FIG. 13, among the two wafers to be joined to each other, only joining metal terminal of one wafer 61 has protrusion 20. Therefore, the description of FIG. 13 is the same as the description of FIG. 12 except that the interval between the wafers is defined only by protrusion 20 of joining metal terminal (3) 71.

Further, the method of manufacturing the joining structure of wafers in the case where a combination of joining metal terminals shown in FIG. 11C to FIG. 11E is used, is the same as the manufacturing method as described with reference to FIG. 12 and FIG. 13.

Note that the wafer described in this specification is not limited only to a circular wafer, but may be a wafer formed by cutting the circular wafer into an arbitrary shape (for example, a quadrangular shape).

Further, in the above, a wafer and a joining structure of the wafers are described, but the same description can be applied to a circuit board and a joining structure of the circuit boards.

It is apparent that the present invention is not limited to the above embodiments, but may be modified and changed without departing from the scope and spirit of the invention.

What is claimed is:

1. A laminated device, comprising:
   a first substrate having a first surface upon which is mounted a first join structure;
   a second substrate having a second surface upon which is mounted a second join structure; and
   a low-melting point metal providing a mechanism to laminate together said first substrate and said second substrate by melting together said first join structure and said second join structure upon an application of heat, so that said first surface and said second surface are adjacent,
   said first join structure including a first conductive film, a protrusion portion and a first metal,
   said protrusion portion being positioned on said first conductive film,
   said first metal covering an upper surface and a side surface of said protrusion portion and a part of said first conductive film, said first metal having a first top surface and a second top surface, said first top surface being higher than said second top surface from said first conductive film, said first metal having a melting point higher than said low-melting point,
   said second join structure including a second conductive film and a second metal, said second metal having a melting point higher than said low-melting point,
   said first top surface of said first metal being contacted directly with said second metal, and
   said low-melting point metal being placed between said second top surface of said first metal and said second metal.

2. The laminated device of claim 1, wherein an adhesive material is applied to at least one of said first surface and said second surface and a pressure is applied to force together said first and said second surfaces when said heat is applied.

3. The laminated device of claim 1, wherein said first substrate and said second substrate respectively comprise either a wafer or a circuit board.

4. The laminated device of claim 1, wherein said low-melting point metal comprises a metal having a melting point of 400° C. or less.

5. The laminated device of claim 4, wherein said low-melting point metal comprises tin.

6. The laminated device of claim 1, wherein said protrusion portion comprises at least one of nickel, gold, silver, and copper.

7. The laminated device of claim 1, wherein both said first join structure and said second join structure include said protrusion portion.

8. The laminated device of claim 1, wherein at least one of said first join structure and said second join structure includes both a portion of low-melting point metal and a protrusion portion.

9. The laminated device of claim 1, wherein said first substrate comprises a third surface being on the opposite side of said first surface, said third surface further includes a third join structure so that said first substrate is similarly laminated with a third substrate via said third join structure, said third substrate comprising one of a wafer, a circuit board, and a chip.

10. The laminated device of claim 9, wherein said second substrate comprises a fourth surface being on the opposite side of said second surface, said fourth surface further includes a fourth join structure so that said second substrate is similarly laminated with a fourth substrate via said fourth join structure, said fourth substrate comprising one of a wafer, a circuit board, and a chip.

11. The laminated device of claim 1, wherein said first substrate comprises a first wafer and said second substrate comprises a second wafer, and said first and second wafers comprise wafer components of a laminated wafer structure.

12. A laminated device, comprising:
a first substrate having a first surface upon which is mounted a first join structure;
a second substrate having a second surface upon which is mounted a second join structure; and
a low-melting point metal providing a mechanism to laminate together said first substrate and said second substrate by melting together said first join structure and said second join structure upon an application of heat, so that said first surface and said second surface are adjacent,
both of said first join structure and said second join structure including a conductive film,
both of said first join structure and said second join structure including a protrusion portion,
both of an upper surface and a side surface of said protrusion portion covered with a first metal having a melting point higher than said low-melting point,
said first metal covering part of said conductive film,
said first metal having a first top surface and a second top surface, said first top surface being higher than said second top surface from said conductive film,
said each first top surface of said first metal in said first join structure and said second join structure is contacted physically during said application of heat, and
said low-melting point metal being placed between said second top surface of said first metal in said first join structure and said second join structure.

13. The laminated device of claim 12, wherein an adhesive material is applied to at least one of said first surface and said second surface and a pressure is applied to force together said first and said second surfaces when said heat is applied.

14. The laminated device of claim 12, wherein said first substrate and said second substrate respectively comprise either a wafer or a circuit board.

15. The laminated device of claim 12, wherein said low-melting point metal comprises a metal having a melting point of 400° C. or less.

16. The laminated device of claim 12, wherein said low-melting point metal comprises tin.

17. The laminated device of claim 12, wherein said protrusion portion comprises at least one of nickel, gold, silver, and copper.

18. The laminated device of claim 12, wherein said first substrate comprises a third surface being on the opposite side of said first surface, said third surface further includes a third join structure so that said first substrate is similarly laminated with a third structure via said third join structure, and said third substrate comprising one of a wafer, a circuit board, and a chip.

19. The laminated device of claim 18, wherein said second substrate comprises a fourth surface being on the opposite side of said second surface, said fourth surface further includes a fourth join structure so that said second substrate is similarly laminated with a fourth substrate via said fourth join structure, said fourth substrate comprising one of a wafer, a circuit board, and a chip.

20. The laminated device of claim 12, wherein said first substrate comprises a first wafer and said second substrate comprises a second wafer, and said first and second wafers comprise wafer components of a laminated wafer structure.

21. A laminated device comprising:
a first substrate having a first surface upon which is mounted a first join structure; and
a second substrate having a second surface upon which is mounted a second join structure,
each of the first join structure and the second join structure including:
a conductor film formed on the substrate and having a first top surface, a second top surface, and a third top surface positioned between the first and second top surfaces;
a protrusion formed on the third top surface of the conductive film; and
a metal including a first metal having a first top surface formed on an upper surface of the protrusion and second and third metals, the first metal being further formed on a side surface of the protrusion, said second and third metals being formed respectively on the first and second top surface of the conductive film and each having a second top surface, the first top surface being higher than said second top surface from the conductive film,
each of the first top surface of the first metal in the first and second join structure being contacted directly, and
a low melting point metal being placed on the second top surface of the second and third metals.

22. The laminated device of claim 1, wherein said first metal has a melting point higher than that of said low-melting point metal.

23. The laminated device of claim 1, wherein:
said first metal includes a first portion having a first part of the second top surface, a second portion having a second part of said second top surface, and a third portion having said first top surface and positioned between said first and second portions;
said second metal includes a fourth portion facing said first portion, a fifth portion facing said second portion, and a sixth portion facing said third portion, and said fourth portion, said fourth portion, and said fifth portion have a same height from said second conductive film; and
said low-melting point metal includes a first low-melting point metal positioned between said first portion and said fourth portion, and a second low-melting point metal positioned between said second portion and said fifth portion.

24. The laminated device of claim 12, wherein:
said first metal belonging to said first join structure includes first and second portions each having said second top surface belonging to said first join structure, and a third portion having said first top surface and positioned between said first and second portions;
said first metal belonging to said second join structure includes fourth and fifth portions each having said second top surface belonging to said second join structure, and a sixth portion having said first top surface and positioned between said fourth and fifth portions;
said first, second, and third portions respectively face said fourth, fifth, and sixth portions; and
said low-melting point metal includes a first low-melting point metal positioned between said first portion and said fourth portion, and a second low-melting point metal positioned between said second portion and said fifth portion.

* * * * *